(12) United States Patent
Fritz

(10) Patent No.: US 8,847,291 B2
(45) Date of Patent: Sep. 30, 2014

(54) STRESS RELIEF FOR PLASTIC ENCAPSULATED DEVICES

(71) Applicant: Atmel Corporation, San Jose, CA (US)

(72) Inventor: Scott N. Fritz, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 13/667,403

(22) Filed: Nov. 2, 2012

(65) Prior Publication Data

US 2014/0124938 A1      May 8, 2014

(51) Int. Cl.
*H01L 29/80*  (2006.01)

(52) U.S. Cl.
USPC ............................................. 257/276; 438/619

(58) Field of Classification Search
USPC .................. 257/276, 788; 438/637, 780, 619
See application file for complete search history.

(56) References Cited

U.S. PATENT DOCUMENTS

| 5,728,453 A | 3/1998 | Wang et al. |
| 6,660,644 B2 * | 12/2003 | Donohoe et al. ............... 438/706 |
| 6,716,766 B2 * | 4/2004 | Ko ................................. 438/734 |

OTHER PUBLICATIONS

Khan et al., "Stress relief in plastic-encapsulated, integrated circuit devices by die coating with photodefinable polyimide," Proc. 38th Electronics Components Conf., pp. 425-431 (1988).

* cited by examiner

*Primary Examiner* — Quoc Hoang
(74) *Attorney, Agent, or Firm* — Fish & Richardson P.C.

(57) ABSTRACT

A semiconductor integrated circuit includes a semiconductor substrate, one or more devices in or on the semiconductor substrate, and a dielectric layer above the one or more devices, wherein the dielectric layer has openings over at least portions of the one or more devices. The semiconductor integrated circuit also includes plastic packaging material (e.g., plastic granules) on a top surface of the dielectric layer and over the openings. In some implementations, the one or more devices include bi-polar transistors, and the openings in the dielectric layer are located over base-emitter junctions of the bi-polar devices.

19 Claims, 7 Drawing Sheets

STRESS RELIEF FOR PLASTIC ENCAPSULATED DEVICES

FIELD OF THE DISCLOSURE

The present disclosure relates to stress relief for plastic encapsulated devices.

BACKGROUND

Plastic encapsulated electronic devices have gained increased acceptance as a result of advantages in size, weight, cost, availability, performance, and state of-the-art technology and design. Nevertheless, one drawback of some plastic encapsulated devices is the stress imparted by the mold material on the die. The pressure can result in various reliability problems, including passivation and passage crack, as well as metal displacement.

Some of the reliability issues can be addressed through the use of low stress molding compounds. Nevertheless, the plastic encapsulation stress can cause parametric shifts in devices from the time of wafer sort until post packaging. Such shifts can cause components to shift outside of device specifications, post packaging, and may increase yield loss, or may require further testing and trimming.

SUMMARY

The present disclosure describes techniques that can help alleviate or reduce pressure on plastic encapsulated devices. In general, the techniques provide for openings in a top-side sealing or glass layer (e.g., a silicon dioxide layer) above the devices. The openings can be located, for example, directly over at least a portion of the devices so as to eliminate or reduce contact with the plastic granules that otherwise may cause stress on the devices.

For example, in one aspect, a semiconductor integrated circuit includes a semiconductor substrate, one or more devices in or on the semiconductor substrate, and a dielectric layer above the one or more devices, wherein the dielectric layer has openings over at least portions of the one or more devices. The semiconductor integrated circuit also includes plastic packaging material (e.g., plastic granules) on a top surface of the dielectric layer and over the openings.

The openings can be located above particular parts of the integrated circuit so as to eliminate or reduce stress that otherwise would be placed on those parts of the integrated circuit when the plastic packaging material is added. For example, in some implementations, the one or more devices include bi-polar transistors, and the openings in the dielectric layer are located over base-emitter junctions of the bi-polar devices. The plastic granules for the packaging material should be sufficiently large that the granules either do not fit into the openings at all, or at least do not contact the bottom surfaces of the openings. The techniques described here can be used with integrated circuits that contain other types of devices as well.

The disclosure also describes a method of fabricating plastic encapsulated semiconductor devices.

In some implementations, one or more of the following advantages are present. For example, by reducing plastic induced package stress, the occurrence of parametric shifts in devices from wafer sort to post-packaging can be reduced. This, in turn, can increase the device yield, reduce additional testing that otherwise may be required following packaging, and reduce overall manufacturing costs.

Other aspects, features and advantages will be readily apparent from the following detailed description, the accompanying drawings and the claims.

DETAILED DESCRIPTION

Figure 1:
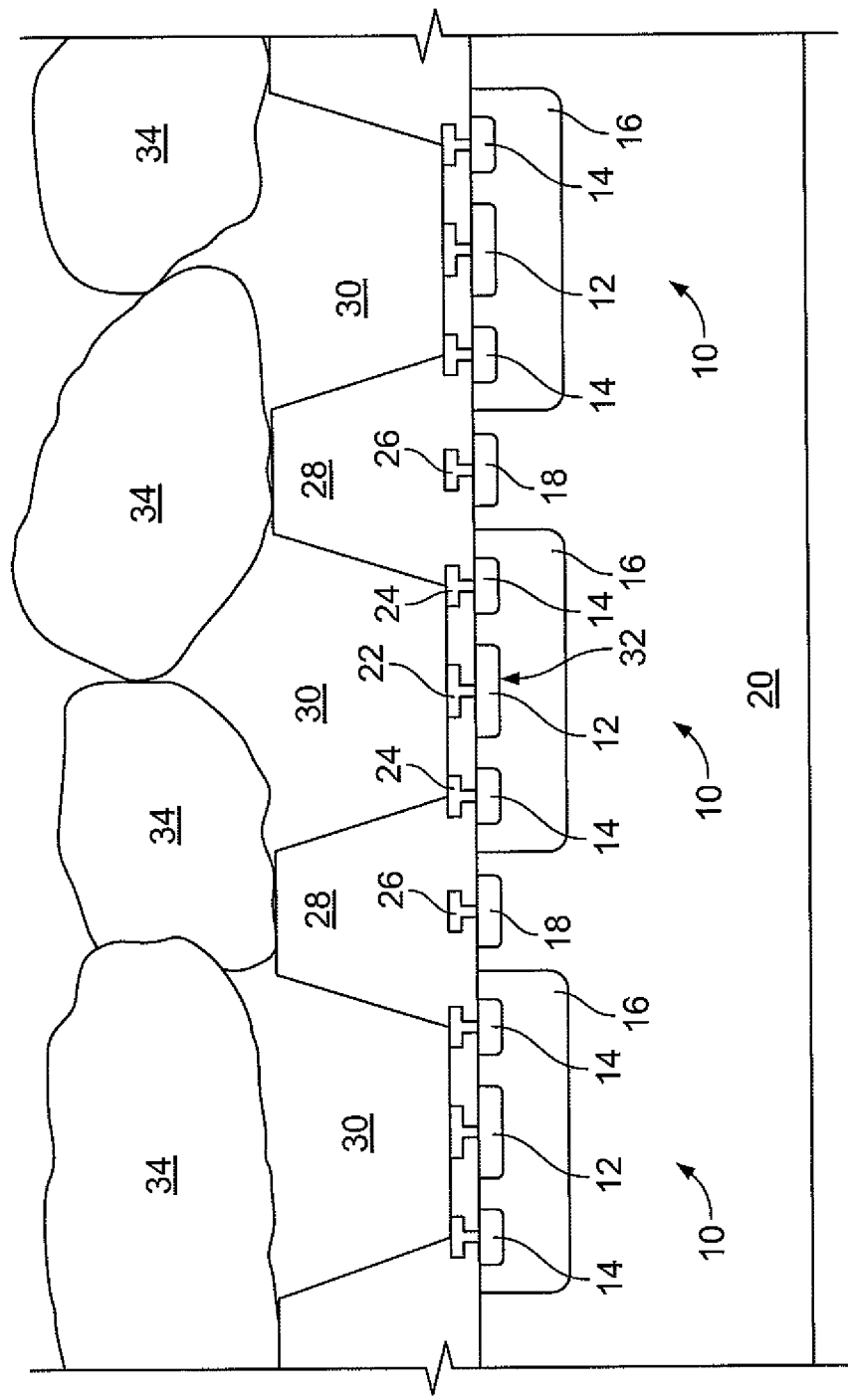
FIG. 1 is a cross-sectional view of a portion of a plastic encapsulated integrated circuit.
Figure 2:
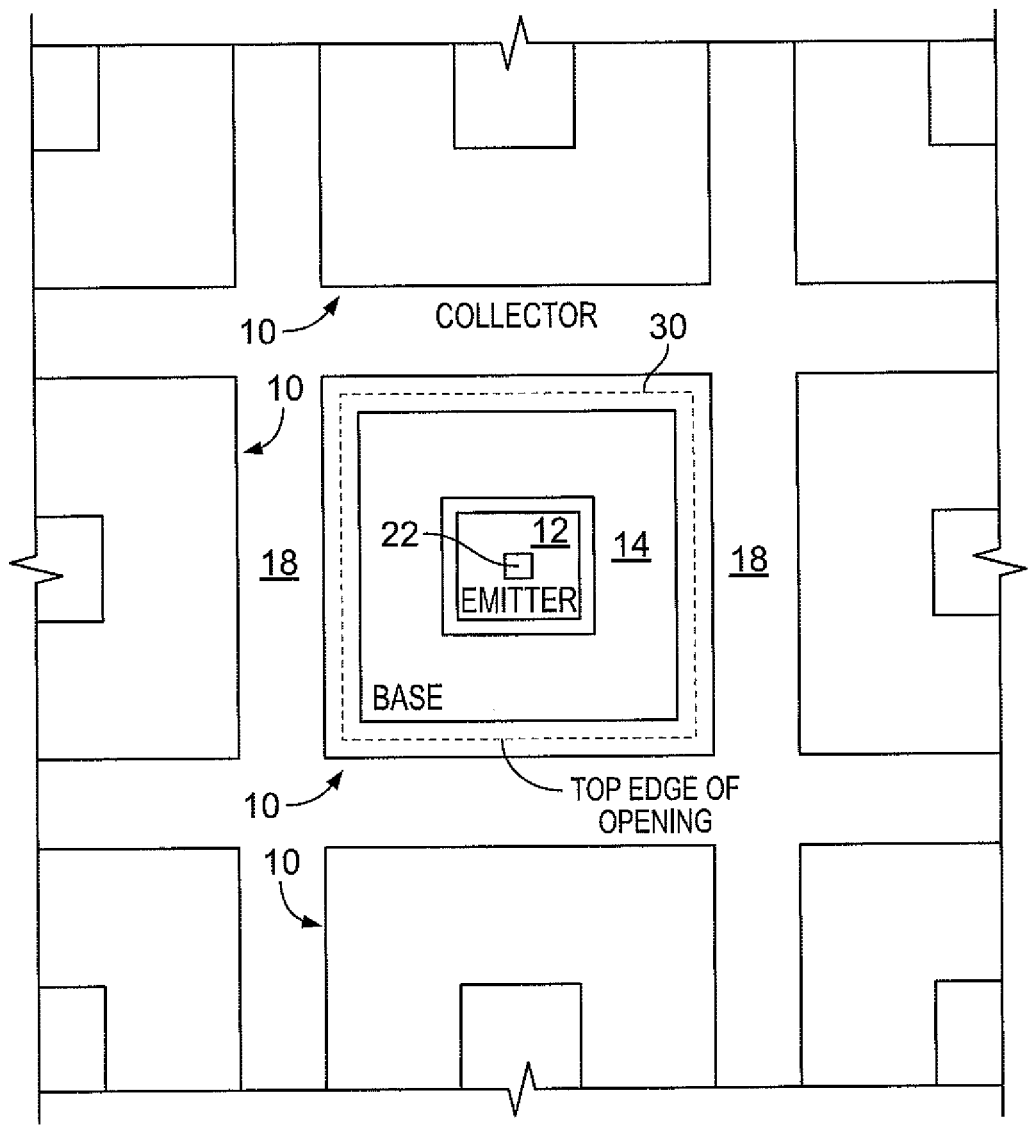
FIG. 2 is a top view showing relative lateral positions of various features of the plastic encapsulated integrated circuit of FIG. 1.
Figure 3:
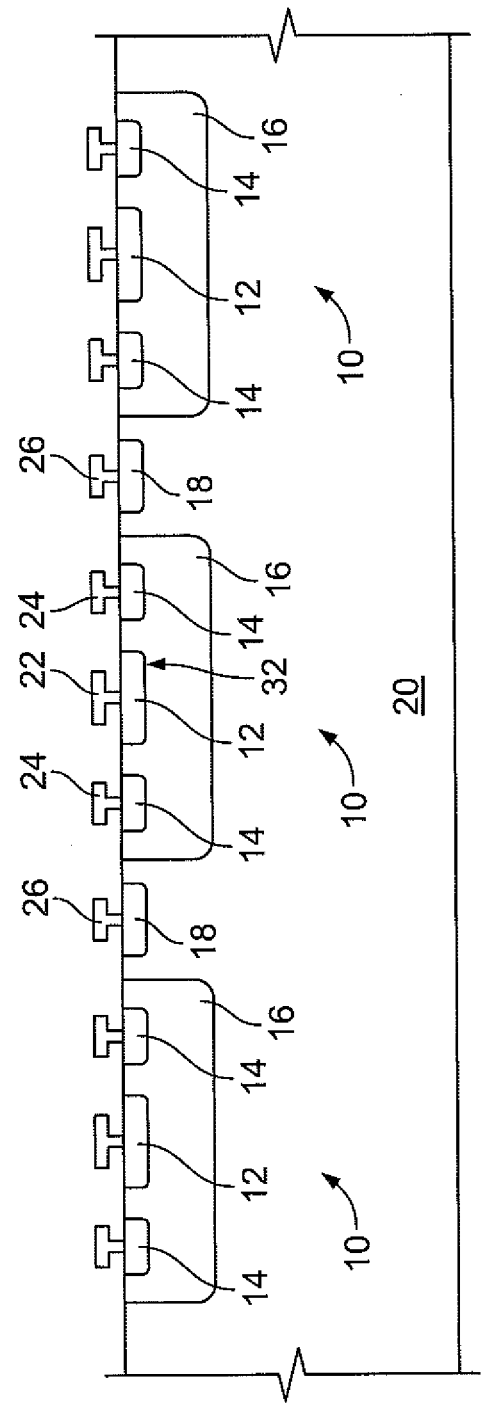
FIGS. 3 through 6 illustrate cross-sectional views during fabrication of the plastic encapsulated integrated circuit.

FIGS. 1 and 2 illustrate an example of a plastic-encapsulated integrated circuit that includes multiple devices 10. In this example, each device 10 is a vertical p-n-p bi-polar transistor, which includes a p+ emitter region 12 and an n+ base contact 14 for the n-type base region 16 below emitter region 12. Each device 10 also includes a p+ collector contact 18 for collector region 20 below base region 16. Collector region 20 can be formed in a silicon or other semiconductor substrate, which also may include many other circuit components electrically connected to one another. Metal pads (i.e., electrodes) 22, 24, 26 are provided, respectively, for the emitter 12, base 14 and collector 18 contacts of each device 10.

A relatively thick top-side sealing layer 28 is provided over the semiconductor device structure, including over devices 10 and pads 22, 24, 26. Top-side sealing layer 28 can be composed, for example, of a dielectric material such as silicon dioxide or oxy-nitride. Other materials also can be used for top-side sealing layer, which in some implementations is a glass layer. The thickness of the top-side sealing layer depends on the implementation, but may be, for example, as much as several thousand angstroms (Å), or more. As illustrated in FIGS. 1 and 2, top-side sealing layer 28 includes openings 30 over at least part of each device 10. In the illustrated example, openings 30 are present at least over the base-emitter junction 32 of each device 10. Openings 30 can have a square, circle or other shape when viewed from above (see, e.g., FIG. 2).

Plastic packaging material 34 is provided over top-side sealing layer 28. Plastic packaging material 34 can be composed, for example, of granules whose size is larger than openings 30 (i.e., the diameter of the granules is larger than the diameter of the openings 30). Therefore, the granules of plastic packaging material 34 do not exert pressure directly on the underlying region of the base-emitter junction 32. Instead, each opening 30 essentially serves as an air cushion between the plastic packaging material 34 and the underlying base-emitter junction 32. As a result, openings 30 can help eliminate or reduce the stress that otherwise would be placed on the base-emitter junctions 32.

FIGS. 3-6 illustrate a sequence of fabrication processes that are included in some implementations of a method of forming a plastic encapsulated integrated circuit. Devices 10 can be fabricated, for example, in substrate 20 by standard semiconductor processing techniques (FIG. 3), which may include photolithographic techniques, implanting of dopants for formation of the emitter 12, base 14 and collector 18 regions, thermal annealing, and patterning of the metallization for pads 22, 24, 26. In some implementations, devices 10 are bi-polar devices fabricated as part of a CMOS process. Some implementations may include additional or different steps.

Figure 4:
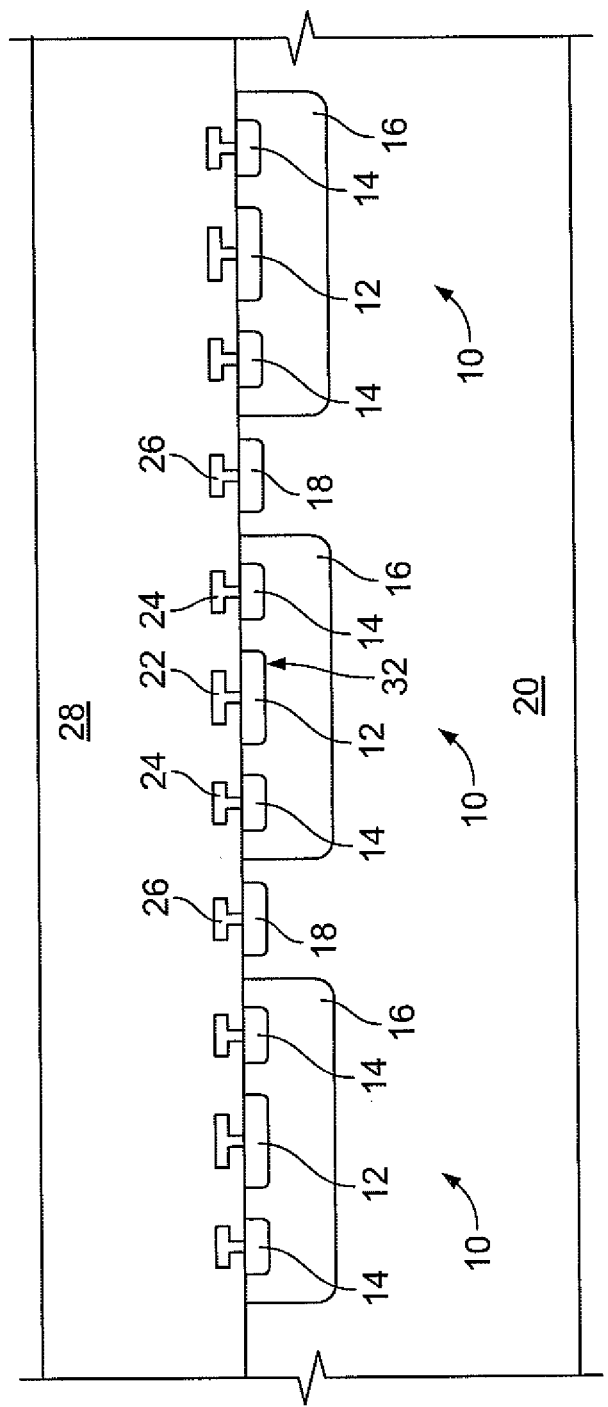
Figure 5:
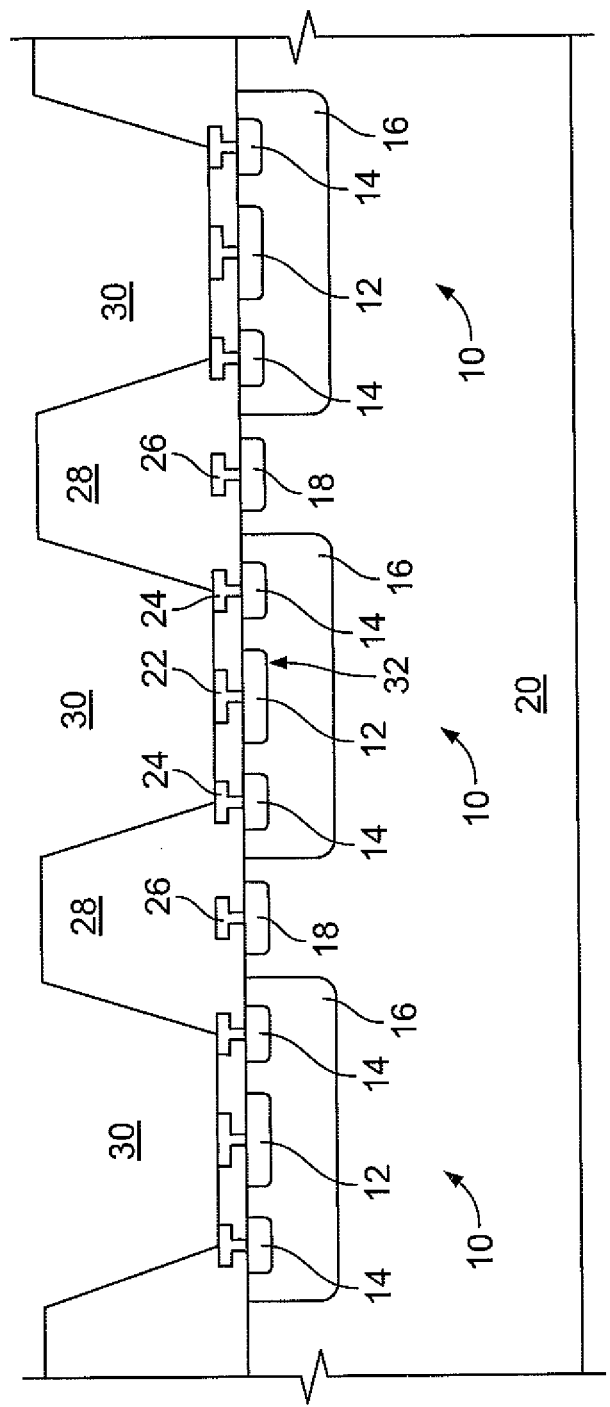
Figure 6:
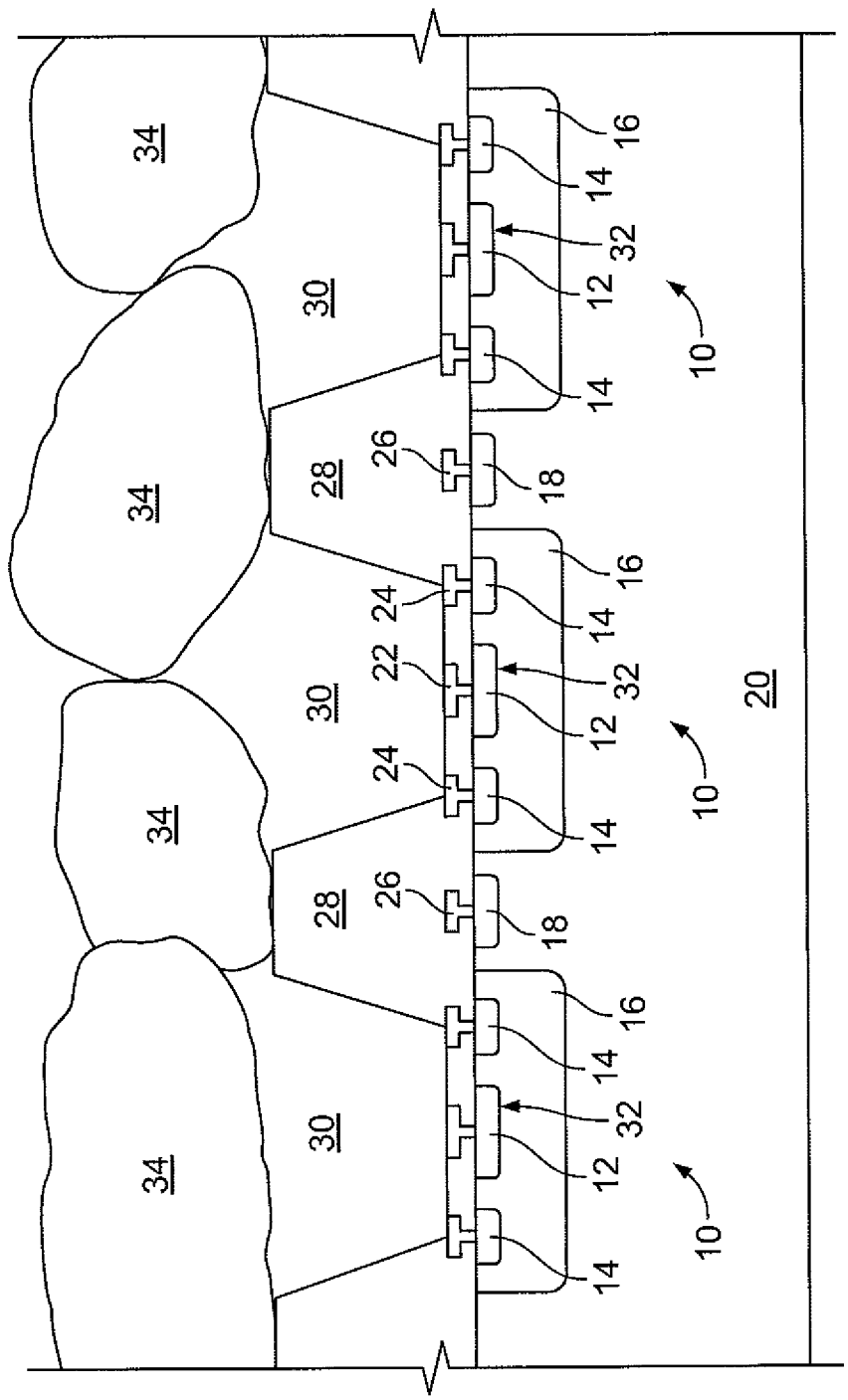

As shown in FIG. 4, a top-side dielectric (e.g., glass) layer 28, such as silicon dioxide, is provided over devices 10. Top-side glass 28 can be provided, for example, through a spin-on or other technique. The top-side glass layer 28 subsequently is patterned using standard photolithographic techniques, and is etched to provide openings 30 (see FIG. 5). Plastic packaging material 34 can then be provided over top-side sealing layer 28 (FIG. 6). The size of the granules for plastic packaging material 34 should be sufficiently large such that the granules do not fall into openings 30 and, in particular, such that the granules do not place pressure directly above the areas defining the base-emitter junctions 32.

Figure 7:
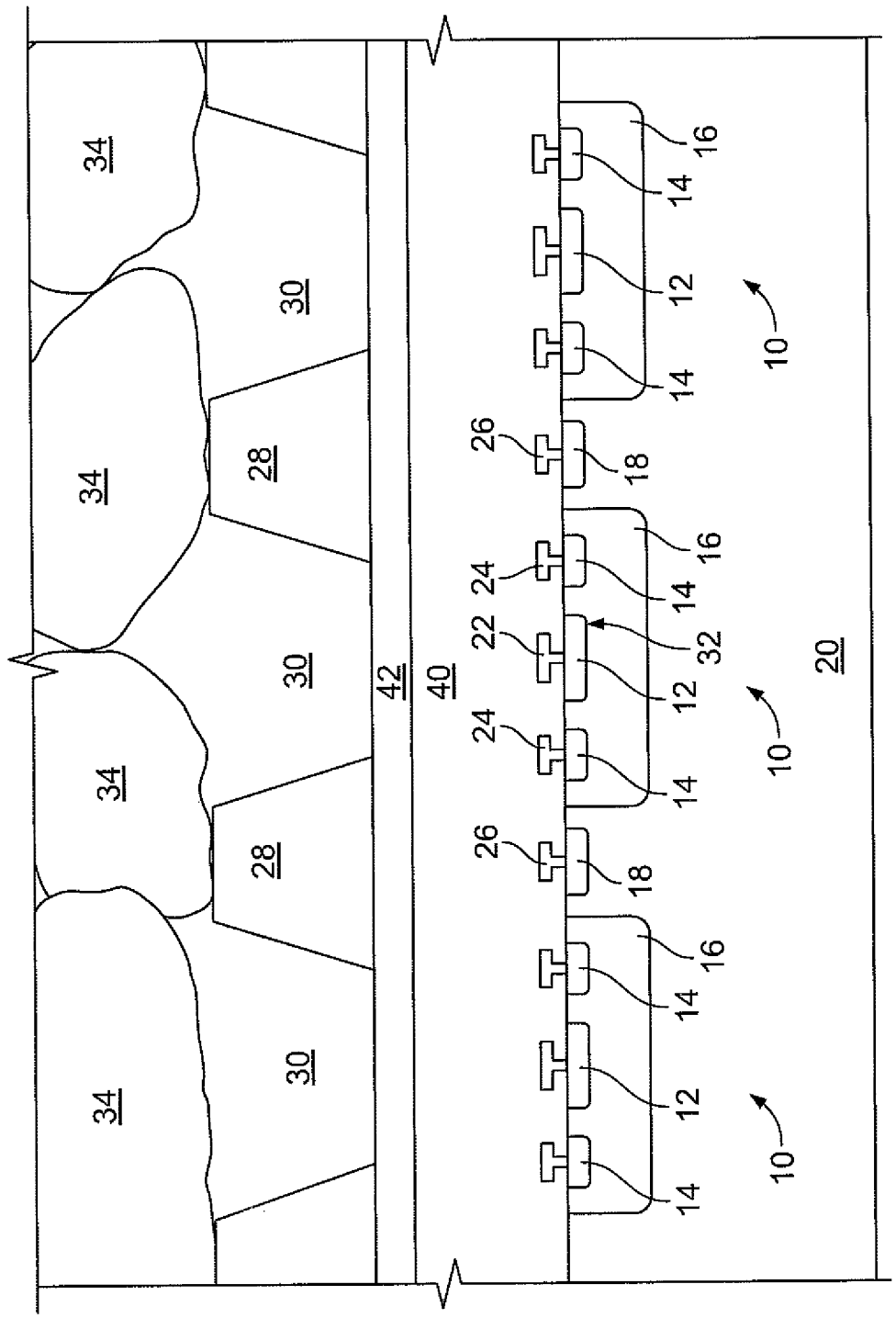
FIG. 7 illustrates another implementation of a plastic encapsulated integrated circuit.

FIG. 7 illustrates another implementation of a plastic encapsulated integrated circuit. In this implementation, prior to providing the top-side glass or sealing layer 28, a dielectric layer 40 (e.g., oxide) is provided over the devices 10. Dielectric layer 40 can serve to planarize the structure and also provides a non-conductive buffer between the metal pads 22, 24, 26 that are below the dielectric layer and a metal layer 42 that is provided over the dielectric layer. The additional metal layer 42, which can extend across the entire structure, can serve as an etch-stop layer during etching of the top-side glass layer 28. In the implementation of FIG. 7, the additional metal layer 42 also protects devices 10 when openings 30 subsequently are etched into top-side glass layer 28. For example, metal layer 42 can act as a shield to prevent devices 10 from being exposed to contaminants during subsequent processing when openings 30 are formed. If etching the top-side glass layer 28 is well-controlled, then it may not be necessary to provide metal layer 42 to achieve the foregoing advantages. Nevertheless, in some implementations, metal layer 42 also may help protect devices 10 from electromagnetic interference (EMI).

Although the foregoing examples describe stress relief for a plastic encapsulated integrated circuit that includes vertical p-n-p transistors, the techniques also can be used in connection with integrated circuits that have different types of bi-polar devices (e.g., n-p-n transistors, lateral transistors, resistors, capacitors, etc.), as well as MOS type devices (e.g., transistors). In various implementations, the openings in the sealing layer can be located above particular parts of the integrated circuit so as to eliminate or reduce stress that otherwise would be placed on those parts of the integrated circuit when the plastic packaging material is added. For example, such openings can be located above the gates or other regions of MOS devices to alleviate stress that otherwise would be placed on those parts of the integrated circuit when the plastic packaging material is added.

Other implementations are within the scope of the claims.

What is claimed is:

1. A semiconductor integrated circuit comprising:
a semiconductor substrate;
one or more devices in or on the semiconductor substrate, wherein the one or more devices include bi-polar transistors;
a dielectric layer above the one or more devices, wherein the dielectric layer has openings over at least portions of the one or more devices; and
plastic packaging material on a top surface of the dielectric layer and over the openings.

2. The semiconductor integrated circuit of claim 1 wherein the openings in the dielectric layer are located over base-emitter junctions of the bi-polar devices.

3. The semiconductor integrated circuit of claim 1 wherein the plastic packaging material is composed of granules having a diameter larger than a diameter of the openings.

4. The semiconductor integrated circuit of claim 3 wherein the plastic packaging material does not come into direct contact with the portions of the one or more devices.

5. The semiconductor integrated circuit of claim 1 wherein the plastic packaging material does not exert pressure directly on the portions of the one or more devices.

6. A semiconductor integrated circuit comprising:
a semiconductor substrate;
one or more devices in or on the semiconductor substrate;
a dielectric layer above the one or more devices, wherein the dielectric layer has openings over at least portions of the one or more devices, wherein the openings in the dielectric layer extend to a metallization layer above the one or more devices; and
plastic packaging material on a top surface of the dielectric layer and over the openings.

7. The semiconductor integrated circuit of claim 6 wherein the metallization layer provides electrode contacts for the one or more devices.

8. The semiconductor integrated circuit of claim 6 including:
a first metallization layer that provides electrode contacts for the one or more devices;
a second metallization layer disposed above the first metallization layer,
wherein the openings in the dielectric layer extend to the second metallization layer.

9. The semiconductor integrated circuit of claim 8 wherein the one or more devices include bi-polar transistors and wherein the openings in the dielectric layer are located over base-emitter junctions of the bi-polar devices.

10. The semiconductor integrated circuit of claim 6 wherein the one or more devices include MOS transistors.

11. The semiconductor integrated circuit of claim 6 wherein the openings in the dielectric layer are located over gate regions of the MOS devices.

12. A semiconductor device package comprising:
a semiconductor device formed in a semiconductor substrate, wherein the semiconductor device is a bi-polar transistor;
a dielectric layer above the semiconductor device, wherein the dielectric layer has an opening over a portion of the device and wherein the opening is located over a base-emitter junction of the bi-polar transistor, and
plastic granules on a top surface of the dielectric layer and over the opening, wherein the plastic granules do not contact a bottom surface of the opening.

13. The semiconductor device package of claim 12 wherein the opening in the dielectric layer provides an air cushion between one or more of the plastic granules and the base-emitter junction.

14. The semiconductor device package of claim 13 wherein the opening extends to a surface of a metallization layer.

15. The semiconductor device package of claim 14 wherein the metallization layer provides contacts for base and emitter regions of the semiconductor device.

16. The semiconductor device package of claim 14 wherein the metallization layer is different from an electrode metallization layer for base and emitter contacts.

17. A method of fabricating a plastic encapsulated semiconductor device, the method comprising:

forming openings in a top-side dielectric layer above devices in a semiconductor substrate, the openings being formed by etching the top-side dielectric layer down to a metallization layer; and depositing plastic granules on the top-side dielectric layer such that the granules do not contact bottom surfaces of the openings.

18. The method of claim 17 wherein each opening is formed above a region that encompasses a base-emitter junction of a bi-polar device in the semiconductor substrate.

19. The method of claim 17 wherein the openings serve as air cushions for plastic granules located directly above the openings.

* * * * *